(12) United States Patent
Taketomi et al.

(10) Patent No.: US 9,870,902 B2
(45) Date of Patent: Jan. 16, 2018

(54) LI-CONTAINING OXIDE TARGET ASSEMBLY

(71) Applicant: KOBELCO RESEARCH INSTITUTE, INC., Kobe-shi (JP)

(72) Inventors: Yuichi Taketomi, Takasago (JP); Moriyoshi Kanamaru, Takasago (JP); Shintaro Yoshida, Takasago (JP)

(73) Assignee: KOBELCO RESEARCH INSTITUTE, INC., Kobe-shi (JP)

( * ) Notice: Subject to any disclaimer, the term of this patent is extended or adjusted under 35 U.S.C. 154(b) by 0 days.

(21) Appl. No.: 14/782,969

(22) PCT Filed: Apr. 28, 2014

(86) PCT No.: PCT/JP2014/061894
§ 371 (c)(1),
(2) Date: Oct. 7, 2015

(87) PCT Pub. No.: WO2014/178382
PCT Pub. Date: Nov. 6, 2014

(65) Prior Publication Data
US 2016/0064200 A1 Mar. 3, 2016

(30) Foreign Application Priority Data

Apr. 30, 2013 (JP) .................................. 2013-095696

(51) Int. Cl.
*C23C 14/35* (2006.01)
*H01J 37/34* (2006.01)
(Continued)

(52) U.S. Cl.
CPC .......... *H01J 37/3417* (2013.01); *C04B 35/01* (2013.01); *C04B 35/447* (2013.01);
(Continued)

(58) Field of Classification Search
CPC ..... C04B 35/01; C04B 35/447; C04B 35/645; C04B 37/026; C04B 2235/3203;
(Continued)

(56) References Cited

U.S. PATENT DOCUMENTS

| 4,209,375 A * | 6/1980 | Gates ................. B23K 35/3013 |
| | | 204/192.15 |
| 2006/0151321 A1* | 7/2006 | Itoh ........................ C23C 14/086 |
| | | 204/298.13 |

(Continued)

FOREIGN PATENT DOCUMENTS

| JP | 63-290273 | 11/1988 |
| JP | 2-11759 | 1/1990 |

(Continued)

OTHER PUBLICATIONS

International Search Report and Written Opinion of the International Searching Authority dated Aug. 5, 2014 in PCT/JP14/061894 Filed Apr. 28, 2014.

*Primary Examiner* — Rodney McDonald
(74) *Attorney, Agent, or Firm* — Oblon, McClelland, Maier & Neustadt, L.L.P.

(57) ABSTRACT

Provided is a target assembly which is manufactured by bonding a Li-containing oxide sputtering target and an Al-based or Cu-based backing plate through a bonding material. The Li-containing oxide target assembly does not undergo warping or cracking during the bonding. The Li-containing oxide target assembly according to the present invention is manufactured by bonding a Li-containing oxide sputtering target to a backing plate via a bonding material, and has bending strength of 20 MPa or larger.

17 Claims, 1 Drawing Sheet

(51) Int. Cl.
| | |
|---|---|
| *C04B 35/01* | (2006.01) |
| *C04B 35/447* | (2006.01) |
| *C04B 35/645* | (2006.01) |
| *C04B 37/02* | (2006.01) |
| *C23C 14/34* | (2006.01) |
| *C23C 14/08* | (2006.01) |

(52) U.S. Cl.
CPC .......... *C04B 35/645* (2013.01); *C04B 37/026* (2013.01); *C23C 14/082* (2013.01); *C23C 14/085* (2013.01); *C23C 14/3407* (2013.01); *C23C 14/3414* (2013.01); *H01J 37/3429* (2013.01); *H01J 37/3435* (2013.01); *H01J 37/3491* (2013.01); *C04B 2235/3203* (2013.01); *C04B 2235/3275* (2013.01); *C04B 2235/6565* (2013.01); *C04B 2235/72* (2013.01); *C04B 2235/721* (2013.01); *C04B 2235/96* (2013.01); *C04B 2235/963* (2013.01); *C04B 2237/12* (2013.01); *C04B 2237/34* (2013.01); *C04B 2237/402* (2013.01); *C04B 2237/407* (2013.01)

(58) Field of Classification Search
CPC .... C04B 2235/3275; C04B 2235/6565; C04B 2235/72; C04B 2235/721; C04B 2235/96; C04B 2235/963; C04B 2237/12; C04B 2237/34; C04B 2237/402; C04B 2237/407; C23C 14/082; C23C 14/085; C23C 14/3407; C23C 14/3414; H01J 37/3417; H01J 37/3429; H01J 37/3435
USPC ........................................ 204/298.12, 298.13
See application file for complete search history.

(56) References Cited

U.S. PATENT DOCUMENTS

| | | | |
|---|---|---|---|
| 2007/0056850 A1* | 3/2007 | Ye ................ | C23C 14/352 204/298.12 |
| 2008/0110746 A1* | 5/2008 | Kardokus ........ | C23C 14/3414 204/192.12 |
| 2008/0173542 A1 | 7/2008 | Neudecker et al. | |
| 2009/0045053 A1 | 2/2009 | Kim et al. | |
| 2009/0166187 A1 | 7/2009 | Nagase et al. | |
| 2010/0003446 A1* | 1/2010 | Hayashi ........... | C04B 35/01 428/64.4 |
| 2015/0014157 A1 | 1/2015 | Taketomi et al. | |
| 2015/0041312 A1 | 2/2015 | Taketomi et al. | |

FOREIGN PATENT DOCUMENTS

| | | |
|---|---|---|
| JP | 11-49562 A | 2/1999 |
| JP | 11-131225 | 5/1999 |
| JP | 11-157844 B2 | 6/1999 |
| JP | 3152108 B2 | 4/2001 |
| JP | 2003-155563 | 5/2003 |
| JP | 2005-36268 A | 2/2005 |
| JP | 2010-202930 A | 9/2010 |
| JP | 2011-521421 A | 7/2011 |
| JP | 2012-20911 A | 2/2012 |
| JP | 2012-136417 A | 7/2012 |
| WO | 2008/012970 A1 | 1/2008 |
| WO | WO 2009/142289 A1 | 11/2009 |
| WO | 2011/086650 A1 | 7/2011 |
| WO | WO 2012/086557 A1 | 6/2012 |

* cited by examiner

LI-CONTAINING OXIDE TARGET ASSEMBLY

TECHNICAL FIELD

The present invention is related to a Li-containing oxide target assembly produced by bonding a Li-containing oxide sputtering target and a backing plate through a bonding material as typified by a brazing material.

BACKGROUND ART

Thin film secondary batteries comprising a Li-containing transition metal oxide such as lithium cobaltate or a Li-containing phosphate compound such as lithium phosphate are capable of charging and discharging, thin in thickness, and light in weight. Taking advantage of the features, the thin film secondary batteries comprising such a Li-containing compound are used in combination with various kinds of electric devices such as a thin film solar cell, a thin-film thermoelectric device, and a wireless charging device. The batteries are used as a power source for a credit card as well. The demand for the thin film secondary batteries is growing rapidly.

For the formation of a Li-containing oxide thin film, a sputtering method is preferably used in which a sputtering target composed of the same raw material as the film to be sputtered. The sputtering method is advantageous in that conditions for the film formation are easily adjusted, and that the film can be easily formed on a substrate of large size.

In general, the sputtering target used for a sputtering method is used as a target assembly in which the sputtering target is bonded to a backing plate by a bonding material such as a solder. The backing plate is referred to as a support. Further, bonding using a brazing material such as a solder are referred to as brazing.

FIGS. 1 and 2 illustrate schematic diagrams of a typical target assembly 21. FIG. 1 is a plan view of a target assembly. FIG. 2 is a longitudinal sectional view of FIG. 1 enlarged at A-A line. A plurality of sputtering targets 24A to 24D are arranged in FIGS. 1 and 2. This is because the area size of the sputtering target tends to increase with increasing demand for film formation on a large substrate by the sputtering method while there are certain kinds of sputtering target which are difficult to be increased in size.

The target assembly 21 illustrated in FIG. 1 comprises four pieces of the sputtering targets 24A to 24D, a backing plate 23 to fix (support) the targets, bonding material 31A to 31C for bonding a plurality of the sputtering targets 24A to 24D and the backing plate 23. Between the plurality of sputtering targets 24A to 24D, gap T is arranged for the purpose of preventing adjacent sputtering targets from contacting and chipping each other due to bending of the backing plate. On the backside (on the side of the bonding material 31A) of the gap T between the plurality of sputtering targets 24A to 24D, lining member 25 is disposed as needed so as to close the gap T. Between the sputtering targets 24A to gap T. 24D and the backing plate 23, spacers 32 are arranged so as to secure a uniform The lining member is also referred to as a stiffening plate.

Among them, the backing plate 23 is used for the purposes of supporting a sputtering targets 24A to 24D as described above in addition to cooling the sputtering targets 24A to 24D which are heated during the film formation. The backing plate 23 is thus generally made of metal materials such as pure Cu, a Cu alloy, pure Al, an Al-made alloy, or pure Ti, having a high thermal conductivity. The sputtering targets 24A to 24D mounted on the backing plate 23 are composed of a metal material in accordance with constituent of a thin film to be formed. Further, generally used as the bonding material 31A to 31C for bonding sputtering targets 24A to 24D and the backing plate 23 is a metal such as a In-based or a Sn-based solder having excellent thermal conductivity, electrical conductivity and a low melting point, or an elastic material such as an elastomer.

The target assembly 21 is produced by disposing the bonding material 31A to 31C between the sputtering targets 24A to 24D which are obtained by machining a sintered body and the backing plate 23, then bonding the sputtering targets and the backing plate by melting the bonding material by way of a heat treatment (bonding process), followed by cooling down to room temperature without changing the arrangement.

However, when the sputtering target and the backing plate are made of different materials, there is a difference in thermal expansion coefficients. Due to the difference in shrinkage after thermal expansion of the sputtering target and the backing plate, and stress caused by solidification shrinkage of the bonding material, which are arisen from a heating treatment and a cooling process, warping is generated in the target assembly. The warping generated in the target assembly causes problems such as cracking of a sputtering target or cracking a warped target assembly which is difficult to be attached to the sputtering apparatus. In order to suppress such warping due to the difference in thermal expansion between a sputtering target and a backing plate, a target assembly is flattened after bonding by being generally subjected to a correction after cooling to a room temperature or restriction in the course of cooling to a room temperature. For the correction, there is a method of, for example, applying mechanical stress in the direction to offset the warpage generated in the assembly. Further, for the restriction, there is a method of, for example, putting a weight or a clamp. Once a target assembly is warped, however, residual stress is left in the target assembly even after the correction and flattening. The residual stress is liable to cause recurrence of the warping during sputtering or at a stage close to the life end of the target, inducing cracking of the target and generation of particles. As a result, the deposition yield is significantly decreased.

It is deeply concerned for the Li-containing oxide target assembly according to the present invention that the difference in thermal expansion coefficient between the Al-based or Cu-based backing plate and the Li-containing oxide sputtering target causes warping and cracking. However, no technology has been proposed so far to solving for the problem.

Patent Document 1, for example, discloses a Li-containing transition metal oxide target having high density as well as a properly-controlled average crystal grain diameter, by which it is possible to stably obtain a sputtered film with superior homogeneity and suppressed variation in terms of composition.

In the meantime, Patent Document 2 is exemplified as a technology for preventing warping and cracking in a target assembly other than those having a Li-containing oxide target.

Patent Document 2 is particularly directed to a ceramic target, and related to a technology to effectively reduce or eliminate warping and cracking of a ceramic target in the course of bonding to a backing plate or during sputtering. The invention of Patent Document 2 was made in consideration that "cracking may occur when mechanical stress more than material strength is applied to the brittle material such as a ceramic, in particular, in a process of mechanical correction or deformation." Finding a peculiar phenomenon that there is a certain direction along which cracking is likely to occur in the course of manufacturing process of the ceramic target, the inventors controlled the grinding direction of machining of the ceramic material.

PRIOR ART DOCUMENTS

Patent Document

Patent Document 1: International Patent Laid-open Publication No. WO2008/012970 pamphlet
Patent Document 2: Japanese Patent Laid-open Publication No. 2011-26863

SUMMARY OF THE INVENTION

Problems to be Solved by the Invention

Patent Document 2 is a technique disclosed in consideration of the phenomenon peculiar to the ceramic material as described above, and may not be directly applied to the target assembly using a Li-containing oxide as in the present invention. Further, Patent Document 1 completely fails to disclose the prevention of warping in a Li-containing oxide target assembly.

The present invention has been made in view of the above-explained circumstances, and its object is to provide a Li-containing oxide sputtering target assembly in which warping or cracking can be suppressed when a Li-containing oxide sputtering target is bonded to a backing plate such as a Al-based or Cu-based plate through a bonding material to produce a target assembly.

Means for Solving the Problems

The Li-containing oxide target assembly of the present invention which was able to solve the problem is characterized in that bending strength of the Li-containing oxide sputtering target is 20 MPa or larger in the target assembly in which the Li-containing oxide sputtering target and the backing plate are bonded via a bonding material.

In a preferred embodiment of the present invention, the Li-containing oxide target assembly is prepared under a non-aqueous condition.

In a preferred embodiment of the present invention, the mean value and the maximum value of the specific resistance of the Li-containing oxide sputtering target are smaller than or equal to 100 Ω·cm and smaller than or equal to 1000 Ω·cm, respectively.

In a preferred embodiment of the present invention, contents of C and Si in the Li-containing oxide sputtering target are suppressed to smaller than 0.01% by mass.

In a preferred embodiment of the present invention, the surface roughness Ra of the Li-containing oxide sputtering target is larger than or equal to 0.1 μm and smaller than or equal to 3.0 μm.

Effects of the Invention

The present invention can provide a Li-containing oxide sputtering target assembly which can effectively suppress warping or cracking of a Li-containing oxide sputtering target when it is bonded to a backing plate such as a Al-based or Cu-based plate through a bonding material.

MODE FOR CARRYING OUT THE INVENTION

Figure 1:
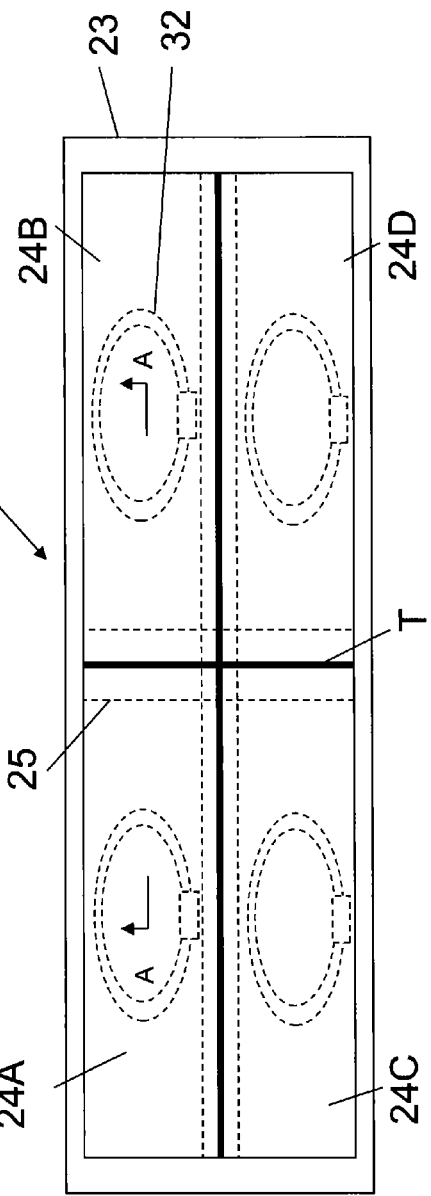
FIG. 1 is a plan view illustrating the configuration of a typical target assembly.

How the present invention has been achieved is explained first.

The present inventors have conducted extensive studies in order to provide a Li-containing oxide target assembly having little warping or few cracks. As a result, various peculiar behaviors were found to be observed when a Li-containing sputtering target was employed as in the present invention. The behaviors were different from metallic sputtering targets other than Li and ceramic sputtering target according to Patent Document 2 as shown below.

(i) The sputtering target became liable to crack when a warped Li-containing oxide target assembly was subjected to a correction treatment or restriction to suppress the warping.

(ii) When sputtering was carried out by using a Li-containing oxide sputtering target, deposition of re-deposited film coming from the sputtering surface was very significant. The re-deposited film is formed on a non-erosion portion of the sputtering target by re-deposition of particles which are knocked out of the sputtering target by a sputtering gas such as Ar. The re-deposited film may cause arcing when they enter an erosion portion of the sputtering target. Further, when the re-deposited film is peeled off during sputtering, it turns to particles, leading to deterioration in film deposition yield.

(iii) Thermal expansion coefficients of Li-containing targets are large as compared with those of other kinds of ceramic materials. For example, lithium cobaltate and lithium phosphate, typical examples of Li-containing oxides, have thermal expansion coefficients of $10.6 \times 10^{-6}/°C$ and $14.4 \times 10^{-6}/°C$, respectively, whereas a thermal expansion coefficient of ZnO is $5.3 \times 10^{-6}/°C$.

(iv) It was found that the Li-containing oxide target peeled off during sputtering even if it was subjected to a similar treatment which was conducted for metal-based targets during the bonding process. It was found that this phenomenon was observed even if bonding ratio of the Li-containing oxide target to the backing plate was increased.

(v) When a Li-containing oxide sputtering target having a low specific resistance was subjected to the bonding to produce an assembly, it was found that the specific resistance of the sputtering target surface was increased, causing abnormal discharge during deposition. The abnormal discharge induces cracking and generation of particles in the sputtering target.

Additional studies were conducted in order to investigate the cause of the phenomenon, accordingly. As a result of the studies, the present inventors have found that the Li-containing sputtering target becomes liable to crack by correction and restriction which are conducted to suppress warpage due to difference in thermal expansions of the sputtering target and the backing plate. This is because the sputtering target is highly hygroscopic and becomes brittle once moisture is absorbed into the target. The mechanical strength is significantly reduced by absorbing moisture. This phenomenon is specific to a target containing Li.

It was also found that the increase in the specific resistance of the Li-containing oxide sputtering target surface after the bonding was caused by contamination by Si and C which were contained in the sputtering target as impurity elements.

As a result of further studies, it was found effective to control the environment of the series of process to manufacture the Li-containing oxide target assembly to non-aqueous conditions so as to prevent the target from absorbing moisture. It was also found effective to control the absorbed moisture so as not to reattach to the Li-containing oxide sputtering target. It was found that the strength of the Li-containing oxide sputtering target was maintained at a high level without degradation by suppressing the moisture absorption in this way, and that warping and cracking of the target assembly can be remarkably reduced. In addition, when members including, for example, a masking tape such as a heat resistant tape or a buffer material such as a silicon rubber sheet, which are ordinary used in a masking process of the Li-containing oxide sputtering target and in a bonding process to join the above-mentioned target and a backing plate, were not used, then amounts of Si and C contaminants contained in the sputtering target were reduced, and increase in the specific resistance on the surface of the Li-containing oxide sputtering target after bonding the bonding was found to be suppressed. The present invention was thus completed.

There is, for example, a following approach as a method for suppressing the moisture absorption by the Li-containing oxide sputtering target in the present invention.

A target assembly is generally manufactured by way of the following processes including an inspection process.

(1) A process in which a powder raw material is sintered to make a sintered body (a Li-containing oxide sintered body in case of the present invention).

(2) A process in which the sintered body is machined while applying cooling water to make a sputtering target (a Li-containing oxide target in case of the present invention).

(3) A process in which the sputtering target thus obtained is bonded to a backing plate.

(4) A process in which a target assembly is obtained by cooling to a room temperature after the bonding followed by correction or restriction in the course of the cooling to a room temperature.

(5) A process in which a bonding ratio of the sputtering target to the backing plate is measured to inspect the quality of the target assembly thus obtained.

(6) A process in which brazing materials or oxides attached to the exterior of the target assembly are removed by polishing or the like.

(7) A process in which the target assembly is cleaned by using an alcohol or the like.

Among the processes (1) to (7), water is involved in (2), (5), and (7). For example, a sputtering target is to be wet and immersed for inspection by a water immersion ultrasonic flaw detection in the process (5). It is thus recommended to carry out these processes under non-aqueous conditions without using water and alcohol as much as possible. That is, the process (2) is to be carried out by dry machining that does not use water; the inspection of the bonding ratio in the process (5) is to be carried out without being wet; and the process (7) is to be carried out without using alcohol. Furthermore, it is also recommended to perform baking in the process (3).

Here, the "non-aqueous conditions" means conditions in which liquid either water or alcohol is not used. In the present invention, one or more of the series of the manufacturing processes for the target assembly, in which liquid water and alcohol are ordinary involved, are performed under the above-mentioned "non-aqueous conditions". Most preferably, all of the processes ordinary involving water and alcohol are carried out under the above-mentioned "non-aqueous conditions".

Specifically, it is firstly recommended to perform the dry machining in which liquid water is not used. Other than that no water is to be used, it is the same as conventional wet machining. Further, the type of machine to be used is not limited, a machine that can be used for wet machining may be used (see examples described below).

Next, it is recommended to carry out baking the Li-containing oxide sputtering target prior to disposing a bonding material in the process (3). This makes it possible to remove hygroscopic moisture once absorbed. It is recommended to perform the baking just prior to disposing the bonding material.

Specific baking methods depend on types and dimensions of Li-containing oxide sputtering targets to be used. For example, in a case of using a brazing material as a bonding material, it is recommended to carry out baking at a mean heating temperature of approximately 1.5 to 2.0° C./minute from a room temperature to a baking temperature when heating a Li-containing oxide sputtering target on a hot plate prior to applying the brazing material. It is also recommended to perform the baking at a temperature of approximately 180±20° C. for about 30 minutes or longer and 120 minutes or shorter. When a baking condition is below the specified range, the effect of baking may not be attained and generation of bubbles from the bonding surface of the sputtering target is increased by way of re-absorption of moisture. When a baking condition exceeds the specified range, thermal oxidation of the sputtering target becomes remarkable and the sputtering characteristics are deteriorated.

It is also necessary to suppress mutual interference of the sputtering targets due to thermal expansion in the course of sputtering and to prevent cracking and generation of particles at the gap as the coefficient of thermal expansion of Li is large. In order to accomplish that, it is important to secure a width of the gap between sputtering targets (details are to be explained below) during cooling to a room temperature after the bonding. It is recommended to secure a predetermined gap space by interposing a spacer for cooling to a room temperature after the bonding process and to control the mean cooling rate from the bonding finish temperature to a room temperature to larger than or equal to 15° C./hour to smaller than or equal to 50° C./hour. This suppresses solo shrinking of the Li-based target, and realizes shrinking of the Li-based target with the backing plate. When the mean cooling rate is larger than the predetermined range, the target becomes liable to crack by thermal shock. Moreover, thermal shrinkage becomes remarkable and misalignment described below becomes uncontrollable. When the mean cooling rate is smaller than the predetermined range, on the other hand, the thermal oxidation of the sputtering target becomes remarkable and the sputtering characteristics are deteriorated.

It is further recommended in the process (3) to apply stress of about 0.02 kg/cm$^2$ or larger and 0.05 kg/cm$^2$ or smaller on the Li-containing oxide target assembly for the purpose of suppressing height difference among the targets and securing the uniformity (detailed explanation is given below) after bonding the sputtering target and the backing plate. For applying the stress, there are methods of, for example, putting a weight on the Li-containing oxide target assembly, and clamping the Li-containing oxide target assembly. If the stress is smaller than the specified range, thickness of the bonding material (brazing material) does not become uniform, and height difference among the Li-containing oxide sputtering targets becomes large. If the stress exceeds the specified range, on the other hand, the target assembly is cracked being not able to withstand the stress.

It is also recommended not to use members such as a heat-resistant masking tape typically used to cover a sputtering surface and a side surface of a target for the purpose of preventing a brazing material from attaching, or a silicone rubber sheet usually used as a buffer material to place a sputtering target on a hot plate. It is thus possible to decrease amounts of Si and C contaminants to be contained in the Li-containing oxide sputtering target.

Furthermore, it is recommended to conduct each of the processing of improving and inspecting the product quality after producing a target assembly as in the processes (5) and (7) under non-aqueous conditions as much as possible.

The present invention is explained in detail in the following.

(Bending Strength)

The present invention is characterized in that bending strength of the Li-containing oxide sputtering target is larger than or equal to 20 MPa in the target assembly wherein the Li-containing oxide sputtering target is bonded to a backing plate via a bonding material. As the target assembly is produced in non-aqueous conditions in the present invention as explained above, material strength of the target becomes large. As a result, later-described warpage of the target may be decreased without cracking the target in the course of subsequent correction.

Considering the issue of cracking, the larger the bending strength of the Li-containing oxide sputtering target is, the more preferable. The bending strength is preferably larger than or equal to 40 MPa, and more preferably larger than or equal to 50 MPa.

"Li-containing oxide" may contain at least Li and an oxide in the present invention. Typical examples are; Li-containing transition metal oxides having a transition metal such as Co, Mn, Ni, and Fe; Li-containing phosphorus compounds such as lithium phosphate; Li-containing boric acid compounds such as lithium triborate. In the present specification, a Li-containing oxide sputtering target may be occasionally simply referred to as a lithium based target.

(Warpage)

The smaller the warpage of a Li-containing oxide sputtering target, the better in the present invention. The warpage is preferably smaller than or equal to 1.5 mm to a total length (in mm) of the Li-containing oxide target assembly. The warpage is more preferably smaller than or equal to 1.0 mm to the total length, and even more preferably smaller than or equal to 0.5 mm to the total length.

Warping in a target assembly is liable to cause cracking in a target which induces abnormal discharge and generation of particles, leading to deterioration in film deposition yield as explained above. Such a problem can be eliminated by the present invention which can provide the Li-containing oxide sputtering target assembly having little warping.

Size of the Li-containing oxide sputtering target constituting the Li-containing oxide target assembly is not particularly limited in the present invention. A large Li-containing oxide sputtering target having a long side of 300 mm or longer may be used for example. Shape of the Li-containing oxide sputtering target is not particularly limited, and may be plate-shape such as rectangular, disk-shape, or the like.

(Misalignment)

The smaller the misalignment, which is a deviation from the standard position in the target assembly as explained in detail below, of a Li-containing oxide sputtering target assembly, the better in the present invention. The misalignment is preferably smaller than or equal to 1.0 mm, and more preferably smaller than or equal to 0.5 mm. If the misalignment is not decreased to the specified range, the area ratio of re-deposited film to the sputtering surface increases to 50% or larger, so as the defects in the deposited film, and the production yield is decreased.

An explanation is given here on the standard position of the target assembly. Positioning is generally performed by referencing to a standard position after applying a brazing material to both a sputtering target and a backing plate and bonding them with each other but before the bonding material is cooled and solidified. The standard position is a distance from an edge plane of the backing plate to an edge plane of the sputtering target. The misalignment is determined by measuring differences in distances between facing edge planes of the backing plate and the sputtering target. The misalignment may be adjusted by controlling the mean cooling rate from a finish temperature of bonding the sputtering target and a backing plate to a room temperature as described above. When the mean cooling rate is larger than the predetermined range, the target is cracked by thermal shock. Moreover, thermal shrinkage becomes remarkable and the misalignment becomes uncontrollable. When the mean cooling rate is smaller than the predetermined range, on the other hand, the thermal oxidation of the sputtering target becomes remarkable and the sputtering characteristics are deteriorated.

(Width of Gap)

The Li-containing oxide target assembly according to the present invention may comprise two or more pieces of Li-based target as illustrated in FIG. 1. In such a case, width of the gap between adjacent Li-based targets is preferably larger than or equal to 0.1 mm and smaller than or equal to 0.5 mm.

Following is a reason why the width of gap was specified in the range. At the gap between sputtering targets, those other than components constituting the sputtering targets such as a brazing material and a backing plate are generally sputtered. The narrower the gap between the targets is, the more preferable, accordingly. However, when sputtering targets are butted together and sputtering is conducted, the targets are heated and expanded during the sputtering, generating cracks at a joining part. Film deposition yield is deteriorated by the generation of the particles. It was found that cracking and particles are generated by mutual interference of the sputtering targets at the gap due to thermal expansion in the course of sputtering because coefficients of thermal expansion of Li-based targets are larger as compared with ceramic materials as described above. In order to suppress the generation of particles, the gap between Li-based targets is preferably larger than or equal to 0.1 mm as described above. It is noted, however, that excessively large gap between Li-based targets causes deterioration in quality of deposited films by sputtering of the gap material which are incorporated as impurities in the deposited films. The upper limit of the gap is preferably smaller than or equal to 0.5 mm, accordingly.

In order to secure the gap of the specified range, it is recommended, as explained above, to secure a gap space by interposing a spacer for cooling after bonding and to control the mean cooling rate from the bonding finish temperature to a room temperature to larger than or equal to 15° C./hour to smaller than or equal to 50° C./hour. This suppresses solo shrinking of the Li-based target and realizes shrinking of the Li-based target with the backing plate. When the mean cooling rate is larger than the predetermined range, the gap space expands and the Li-based target is cracked by thermal shock. When the mean cooling rate is smaller than the predetermined range, on the other hand, the gap space becomes small.

(Height Difference Between Li-Containing Oxide Sputtering Targets)

When the Li-containing oxide target assembly according to the present invention comprises two or more pieces of Li-based targets, height difference between the Li-based targets is preferably smaller than or equal to ±0.5 mm.

Because Li-based sputtering targets are highly hygroscopic as explained above, they release the absorbed moisture in a sputtering chamber. If the height difference between the Li-based targets is large, the released moisture is re-adsorbed onto edges of gap between the targets having large difference in height before being evacuated from the chamber. Discharge stability is deteriorated at the edges, particles are generated by way of chipping the edges, resulting in degradation of film deposition yield.

It is recommended to put a predetermined stress onto the target assembly as explained above for the purpose of securing the uniformity of the height difference between the Li-based targets to the specific range.

(Bonding Ratio of Sputtering Target to Backing Plate)

The bonding ratio of the Li-containing oxide target assembly according to the present invention is preferably larger than or equal to 90%, more preferably larger than or equal to 95%, furthermore preferably larger than or equal to 99%. It is noted here that the bonding ratio indicates an area ratio of a portion where sputtering target is adhering to In to an entire area of the sputtering target bonded to a backing plate.

The reason of the limitation is as in the following. When a highly hygroscopic Li-based target was subjected to heating for bonding, it was found that adsorbed moisture was released, which generates bubbles in the brazing material and deteriorates the bonding ratio. Low bonding ratio deteriorates cooling efficiency of a target during sputtering, inducing failure in cooling the Li-based target. According to experimental results by the present inventors, it was found that cracking occurred due to heating by sputtering at a position corresponding to the failure in cooling in the target, and deterioration in film deposition yield was induced by generation of particles.

In order to enhance the bonding ratio to the range, it is effective to conduct a predetermined baking prior to the bonding and removing the adsorbed moisture as explained above. Generation of bubbles in the brazing material is thus suppressed, and the bonding ratio is enhanced to 90% or larger.

(Thickness of Brazing Material)

When a brazing material is used for the bonding material, the thickness of the brazing material is preferably larger than or equal to 0.1 mm, more preferably larger than or equal to 0.2 mm, and even more preferably larger than or equal to 0.3 mm.

Moisture in the highly hygroscopic Li-based target can be released by the baking as explained above. However, it was found by studies by the present inventors that the bonding ratio was deteriorated due to repelling of brazing material by the bubbles when the thickness of the brazing material was smaller than 0.1 mm. The deterioration of the bonding ratio can be suppressed by conducting the baking as well as controlling the thickness of the brazing material to 0.1 mm or larger. The upper limit of the thickness of the brazing material is not particularly limited as long as shrinkage cavities are not generated.

(Surface Roughness Ra of Li-Containing Oxide Sputtering Target after Bonding)

Surface roughness Ra of a Li-containing oxide sputtering target in the Li-containing oxide target assembly according to the present invention is preferably larger than or equal to 0.1 μm after the bonding. The Ra may be determined based on JIS B 0601: 2001.

In general, when a surface roughness Ra of a target becomes large, arching is generated and stability of film deposition is deteriorated. It is thus preferable that Ra is as small as possible and that the surface is as smooth as possible. However, the Li-based target according to the present invention is highly hygroscopic and releases absorbed moisture in a sputtering chamber. According to experimental results by the present inventors, it was found that when the Ra was smaller than 0.1 μm, the specific surface area of the sputtering surface was decreased, release of the moisture became insufficient, and abnormal discharge was induced at the initial stage of discharging. By controlling the Ra to 0.1 μm or larger, specific surface area sufficient to release the moisture may be secured, and stable discharge may be maintained.

Methods to control Ra are not particularly limited as explained above, and ordinary used methods may be employed. Specifically, for example, a method of finishing a sputtering surface by machining, or a method of polishing a bonded target surface by a vibration type polishing machine with adjusting by way of using a nonwoven fabric or the like may be employed.

(Thickness of Indium Oxide Layer Present at the Bonding Surface)

When an indium-based solder is used for the bonding material in the Li-containing oxide target assembly according to the present invention, thickness of the indium oxide layer is preferably smaller than or equal to 100 μm at a bonding surface to the Li-based target.

An explanation is given here why the indium oxide layer was controlled. According to studies by the present inventors, it was found that there may be cases in which a Li-based target was come off from a backing plate or a brazing material was eluted during sputtering inducing abnormal discharges even if the bonding ratio of the Li-based target to the backing plate was 90% or larger, and even 95% or larger. Because the Li-based sputtering target is highly hygroscopic, moisture is released from the target which is heated for bonding. If water vapor is included in the indium which is used as the brazing material, an indium oxide layer comes to present over the entire interface in the vicinity of the Li-based target. As a result, it was elucidated that cooling efficiency during sputtering was deteriorated even if the bonding ratio was apparently fine, that Li-based target came off during sputtering, inducing abnormal discharges. As a result of further investigation, the problems were found to be solved by decreasing thickness of the indium oxide layer to smaller than or equal to 100 μm. It was also found effective to carry out baking under a predetermined condition before bonding by using a bonding material.

(Amounts of Si and C Contained in Li-Containing Oxide Sputtering Target after being Processed to the Target Assembly)

The respective amount of Si and C is preferably controlled to smaller than 0.01% by mass so that the increase in specific resistance of the target after the bonding may be suppressed. Detailed explanation is given in this regard in the following.

When a target assembly is prepared by bonding a sputtering target, a sputtering surface and side surfaces of the sputtering target are usually covered with a masking material such as an aluminum foil for the purpose of preventing attachment of a brazing material. There may be a case in that the masking material is fixed by using a masking tape such as a kapton tape. For a fragile ceramic-based sputtering target, there may be a case in that the sputtering target is disposed on a buffer material such as a silicone rubber sheet or the like placed on a hot plate in order to prevent cracking by thermal shock during bonding. There may be another case in that a heat insulating cover such as an aluminum foil is disposed for the purpose of controlling the temperature and preventing cracking by the thermal shock as described above.

It was found, however, that the sputtering target was cracked due to abnormal discharges when the target assembly was subjected to sputtering. It was then revealed by investigation conducted by the present inventors that specific resistance was significantly increased at the surface of the sputtering target. As a result of further detailed investigation, the increase in the specific resistance of the target surface was caused by contaminations of Si and C onto the surface to which a masking tape or a silicone rubber sheet was attached. Although the detailed reason is unknown, it is considered that the carbon contamination is due to formation of insulating lithium carbonate $Li_2CO_3$ on the surface of the Li-based target. The contamination of Si is considered due to change of Si to a polysiloxane component on the surface of the Li-based target. We stopped using members such as a masking material and a buffer material which could induce contaminants of Si or C, accordingly. A Li-containing oxide target assembly free of the contaminations can thus be obtained.

By employing the method according to the present invention, mean value of the specific resistance of the Li-containing oxide sputtering target can be decreased, for example, to 100 Ω·cm or smaller. A maximum value of the specific resistance can be decreased, for example, to 1000 Ω·cm or smaller. The specific resistance may be measured by a method described in an example below.

Detailed description has been made on the Li-containing oxide target assembly according to the present invention hereinabove.

The present invention is characterized in that the production process was carried out under conditions in which adsorbing moistures is avoided as much as possible in consideration of highly hygroscopic nature of the Li-based target, by which deterioration of bending strength of the target is prevented, and hence warping and cracking the Li-containing oxide target assembly are circumvented. Another feature of the present invention is that increase in specific resistance on the surface of the target after the bonding is suppressed by not using members such as a masking tape typically used to prevent a brazing material from attaching or a silicone rubber sheet usually used as a buffer material and hence decreasing amounts of Si and C contaminants contained in the Li-containing oxide sputtering target. Each of the components constituting the Li-containing oxide target assembly according to the present invention is not particularly limited as long as it is normally used, accordingly.

Figure 2:
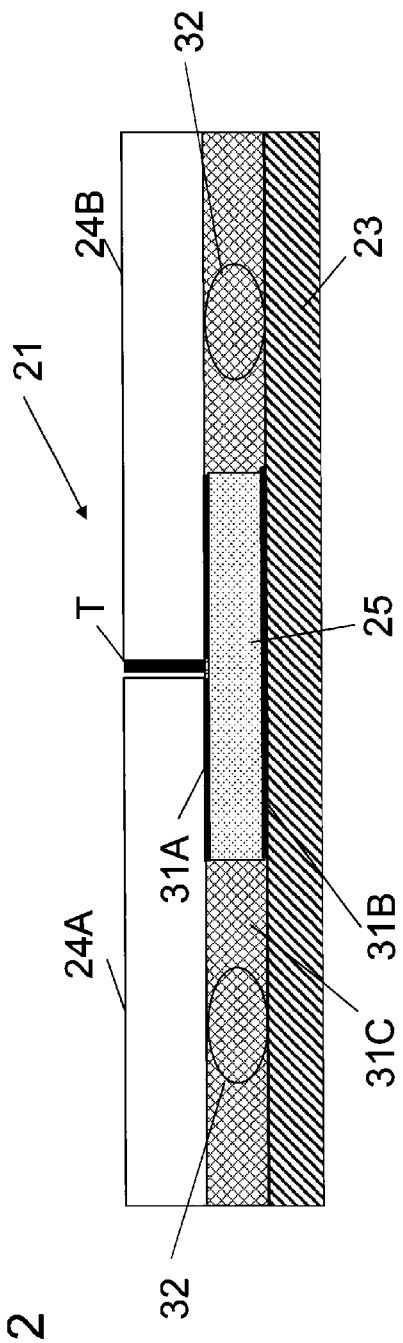
FIG. 2 is a longitudinal sectional view of FIG. 1 enlarged at A-A line.

Preferred embodiments of the present invention are explained by referring to the FIGS. 1 and 2 hereinbelow. It is noted, however, that the present invention is not limited to the embodiment illustrated in FIG. 1. The lining member 25 used in the configuration illustrated in FIG. 1, for example, may be omitted.

Various kinds of generally-known materials may be employed for the backing plate 23. Copper, various kinds of copper alloys, aluminum, and various kinds of aluminum alloys are used for the backing plate having high thermal resistance, electrical conductivity, and thermal conductivity.

Typically used as the bonding material 31A to 31C is a low melting point solder such as a In-based or a Sn-based material or an elastic material such as an elastomer. In is an example of the In-based material. Sn—Zn alloy is an example of the Sn-based material. The In-based material is more preferable. For the bonding materials 31A to 31C illustrated in FIG. 2, a common or different kinds of bonding material of low melting point solder may be used. Considering the working efficiency, a common material is preferably used.

The width of the gap T disposed between the sputtering targets 24A to 24 D may be preferably set in a proper manner according to Li-based target to be used, bonding material 31A to 31C, and kind and size of backing plate 23. The width of the gap is preferably to be about 0.1 to 0.5 mm.

The spacer 32 is disposed between the sputtering targets 24A to 24D and the backing plate 23 so that a uniform gap may be secured therebetween. Material of the spacer is not particularly limited as long as it has high electrical and thermal conductivities. All of ordinary used materials in the field of sputtering targets may be employed. For example, a Cu wire may be used for the spacer 32.

The lining member 25 is disposed on a backside (on the side of bonding surface, facing the backing plate) of the gap T so that the bonding material would not leak out of the gap between respective targets. Material of the lining member is not particularly limited as long as it has high electrical and thermal conductivities. All of ordinary used materials in the field of sputtering targets may be employed.

A widely-used method may be employed for producing the Li-containing oxide target assembly according to the present invention as long as the processes explained above are considered.

There is, for example, a hot press sintering method for producing a Li-containing oxide sintered body. The hot press is carried out for an oxide powder raw material filled into a graphite mold. In the filling into the graphite mold, the raw material powder may directly be filled without any pre-forming, or may be filled once into another mold and then pre-formed with a mold press, after which the pre-form may be filled into the graphite mold. The latter pre-forming is performed for the purpose of improving the handling abilities when the pre-form is set to a prescribed mold in the hot press process, and the raw material may preferably be made into a pre-form by the application of a pressure of, for example, about 0.5 to 1.0 tonf/cm². Preferred conditions for the hot press are; sintering temperature of 700 to 1000° C., retention time of 100 hours or shorter, environment during sintering of vacuum or nitrogen or the like.

The present application claims the benefit of priority based on Japanese Patent Application No. 2013-95696 filed on Apr. 30, 2013, of which disclosure is incorporated by reference herein in its entirety.

EXAMPLES

The present invention is described hereinafter more specifically providing experimental examples, but the present invention is not limited to the following examples. The present invention can be put into practice after appropriate modifications or variations are added within a scope adaptable to the spirit of the present invention, all of which are included in the technical scope of the present invention.

Example 1

In the present example, by using a lithium cobaltate ($LiCoO_2$) sintered body and a lithium phosphate ($Li_3PO_4$) sintered body as raw materials of the Li-containing oxide sputtering target, bending strength was measured as explained in the following. Further, warpage of the target assemblies prepared using each of the sintered bodies was measured as explained in the following.

(Preparation of Oxide Sintered Body)

A lithium cobaltate ($LiCoO_2$) sintered body was prepared as explained in the following.

A commercially available $LiCoO_2$ fine powder having a purity of 99.99% or higher and mean grain size of 10 μm or smaller was used for the raw material powder.

The raw material powder of 3 kg in weight was filled into a graphite mold without any pre-forming. An oxide sintered body of 300 mm in diameter was obtained by sintering using a hot pressing method. Conditions of the hot pressing were; a sintering temperature of 930° C., a retention time of 1.5 hour, an atmosphere during sintering of either vacuum or nitrogen, and a plane pressure of 300 kgf/cm².

A lithium phosphate ($Li_3PO_4$) sintered body was prepared as explained in the following.

A commercially available $Li_3PO_4$ fine powder having a purity of 99.9% or higher and a mean grain size of 5 μm or smaller was used for the raw material powder.

The raw material powder of 1.5 kg in weight was filled into a graphite mold without any pre-forming. An oxide sintered body of 300 mm in diameter was obtained by sintering the powder using a hot pressing method. Conditions of the hot pressing were; a sintering temperature of 920° C., a retention time of 1.5 hour, an atmosphere during sintering of either vacuum, and a plane pressure of 250 kgf/cm².

Lithium cobaltate ($LiCoO_2$) and lithium phosphate ($Li_3PO_4$) sintered bodies thus obtained were subjected to a wet processing or a dry processing in an air atmosphere as explained in the following.

(a) Wet Processing

Each of the oxide sintered bodies was grinded to a predetermined thickness of 3 mm by using a surface grinder, and then cut to a predetermined size of 4 mm in width and 50 mm in total length by using a surface grinder. In the series of grinding, cutting and the final finishing process of the wet processing, cooling water was fed to the oxide sintered body.

(b) Dry Processing

Dry processing was conducted in a similar manner to the above-explained wet processing (a) except that cooling water was not used in the series of the process.

Then, bending strength was measured according to JIS R0601: 2001 for each of the oxide sintered body thus obtained. Specifically, specimen for measuring the bending strength were prepared in a size of 50 mm in total length, 4 mm in width, and 3 mm in thickness. Using a universal precision testing equipment 5584 available from Instron Japan Co., Ltd., bending strength of respective specimen was measured at a test rate of 0.5 mm/min, a test temperature of room temperature, and a low part span of 30 mm.

(Preparation of Target Assembly)

Each of the sintered bodies obtained as explained above was processed under respective condition indicated in Table 1 to prepare a sputtering target having a size of 6 mm in thickness, 110 mm in shorter side, and 170 mm in longer side. Each of the sputtering targets thus obtained was subjected to baking at a mean heating rate of 2° C./min. to a surface temperature of 180±10° C. and held at the temperature for 30 minutes on a hot plate. During the heating, the sputtering target was covered with an aluminum foil as a heat insulating cover for the purpose of controlling the surface temperature. Next indium was pasted onto a bonding side of the sputtering target which was subsequently bonded to a cooling plate pasted with indium. Then it was cooled down to a room temperature at a mean cooling rate of 28.8° C./hour to obtain a target assembly. Each of the target assemblies thus obtained was placed facing the sputtering surface onto a surface plate. A straight edge was placed on the cooling plate. By defining a gap from the straight edge to the cooling plate as "warpage of target assembly", the gap was measured by using a depth gauge. In the present embodiment, target assemblies having a warpage of 1.5 mm or smaller were rated acceptable while those having a warpage of larger than 1.5 mm were rated unacceptable.

The results are summarized in Table 1.

TABLE 1

| No. | Material | Processing method | Hot press atmosphere | Bending strength (MPa) | Warpage of target assembly (mm/total length) | Result |
|---|---|---|---|---|---|---|
| 1 | $LiCoO_2$ | wet | nitrogen | 9 | 1.9 | Unacceptable |
| 2 | $LiCoO_2$ | wet | vacuum | 12 | 1.6 | Unacceptable |
| 3 | $LiCoO_2$ | dry | nitrogen | 55 | 0.2 | Acceptable |
| 4 | $LiCoO_2$ | dry | vacuum | 49 | 0.5 | Acceptable |
| 5 | $Li_3PO_4$ | wet | vacuum | 18 | 1.7 | Unacceptable |
| 6 | $Li_3PO_4$ | dry | vacuum | 62 | 0.2 | Acceptable |

When the $LiCoO_2$ and $Li_3PO_4$ sintered bodies were prepared by the dry processing as recommended by the present embodiment, high bending strength of 20 MPa or larger was obtained as indicated by Nos. 3, 4, and 6 in Table 1. Further, when the sintered bodies having the high bending strength were used for the target assemblies, the warpage was small and suppressed to smaller than or equal to 1.5 mm to the total length.

When the $LiCoO_2$ and $Li_3PO_4$ sintered bodies were prepared not by the dry processing but by the wet processing as for Nos. 1, 2, and 5 in Table 1, the bending strength were much smaller than 20 MPa. Further, when the sintered bodies having the low bending strength were used for the target assemblies, the warpage became large and exceeded 1.5 mm to the total length. When the warpage is large, the target becomes liable to crack, abnormal discharge and particles are induced, resulting in low yield in film deposition processes.

It should be noted here that kind of grinding machines is not particularly limited although the grinding was carried out by using a surface grinder in the present embodiment. A similar result was obtained when a grinding center was employed for grinding although the result is not indicated in the table.

which the measured area ratio of re-deposited film was 50% or smaller were rated acceptable.

The results are summarized in Table 2. The rightmost column in Table 2 is for total judgment. When all of the criteria regarding the misalignment of the target assembly, the width of the gap, and the area ratio of re-deposited film were satisfied, then the total judgment was rated acceptable. When any one of the criteria was not satisfied, then the total judgment was rated unacceptable.

TABLE 2

| No. | Material | Misalignment of target assembly (mm) | Width of gap (mm) | Area ratio of re-deposited film (%) | Mean cooling rate (° C./hour) | Total judgment |
|---|---|---|---|---|---|---|
| 1 | $LiCoO_2$ | 0.5 | 0.2 | 38 | 28.8 | Acceptable |
| 2 | $LiCoO_2$ | 0.8 | 0.3 | 41 | 38.8 | Acceptable |
| 3 | $LiCoO_2$ | 1.0 | 0.3 | 49 | 48.8 | Acceptable |
| 4 | $LiCoO_2$ | 1.1 | 0.7 | 57 | 68.8 | Unacceptable |

From the results described above, it was elucidated that preparing a Li-containing oxide sintered body by using the dry processing was extremely effective to produce the highly hygroscopic Li-containing oxide sputtering target. It was considered that high level of strength was maintained without degrading the bending strength because the moisture in the sintered body was removed. The problems of warping and cracking were thus solved in the target assemblies prepared by using the sputtering target.

Example 2

In the present example, a lithium cobaltate ($LiCoO_2$) sintered body was used as a raw material of the Li-containing oxide sputtering target. Misalignment of the target assembly, width of gap between adjacent targets, and area ratio of re-deposited film were measured as explained in the following.

In above-described No. 3 of example 1, two pieces of sputtering targets having an identical size of 6 mm in thickness, 110 mm in shorter side, and 170 mm in longer side were prepared and bonded to a cooling plate so that the shorter sides of the targets were adjacent to each other. The target assemblies were prepared in the same manner as No. 3 in the example 1 except that each of the target assemblies was cooled down to a room temperature at respective mean cooling rate as indicated in Table 2.

Firstly, in order to measure the misalignment of respective target assembly thus obtained, a distance from an edge of the cooling plate to a side surface of the target was measured by using a depth gauge. The measurements were conducted for both side surfaces of a shorter side and a longer side of the target. The misalignment was determined by dividing a measured value for the two facing sides by a factor of 2. The target assemblies which had a misalignment thus derived of 1.0 mm or smaller were rated acceptable in the present example.

Further, the width of gap between adjacently bonded targets was measured by inserting a clearance gauge to the gap. In the present example, those for which the measured width was in a range from 0.1 mm to 0.5 mm were rated acceptable.

The area ratio of re-deposited film to the sputtering surface was measured by taking a picture of the sputtering surface subjected to sputtering, binarizing the picture, and dividing total area of the re-deposited films by total area of the sputtering surface. In the present example, those for As indicated by the results of Nos. 1 to 3 in Table 2, when the mean cooling rate (see column for mean cooling rate of Table 2) from the bonding finish temperature to the room temperature was controlled to 15 to 50° C./hour, the misalignment of the target assembly was 1.0 mm or smaller, the width of gap between adjacent targets was controlled to a range from 0.1 to 0.5 mm, and the area ratio of re-deposited film was suppressed to 50% or smaller.

When the mean cooling rate was larger than 50° C./hour as in the case of No. 4 in Table 2, on the other hand, thermal shrinkage of the target became significant, inducing large misalignment of the target assembly and large width of gap between adjacent targets. The area ratio of re-deposited film was also increased with the misalignment, resulting in lower film deposition yield.

Example 3

In the present example, by using a lithium cobaltate ($LiCoO_2$) sintered body as a raw material of the Li-containing oxide sputtering target, the height difference between the targets and the thickness of the indium oxide layer were measured as explained in the following.

Specifically, after bonding two pieces of targets to a cooling plate by the same method as the above-described example 2, a weight was disposed on each of the targets so that the stress after the bonding were in accordance to the values indicated in Table 3, and the mean cooling rate was controlled to 28.8° C./hour from bonding finish temperature to room temperature to obtain the target assemblies.

The height difference between the targets in the target assemblies was measured as a distance from a higher target surface to a lower target surface by referencing the higher target among the two by using a depth gauge. In the present example, target assemblies having a measured height difference between the targets of ±0.5 mm or smaller were rated acceptable.

The thickness of brazing material was measured by using a depth gauge after bonding two pieces of targets to a cooling plate. The thickness was determined by measuring a height from the surface of the target to the surface of the cooling plate, followed by subtracting thickness of the target. In the present example, target assemblies having the measured thickness of a brazing material of 0.1 mm or larger were rated acceptable.

The results are summarized in Table 3. The rightmost column in Table 3 is for total judgment. When all of the criteria regarding the height difference between targets, the thickness of the brazing material, and the stress after the bonding were satisfied, then the total judgment was rated acceptable. When any one of the criteria was not satisfied, then the total judgment was rated unacceptable.

TABLE 3

| No. | Material | Height difference between targets (mm) | Thickness of brazing material (mm) | Stress after bonding (kg/cm$^2$) | Total judgment |
|---|---|---|---|---|---|
| 1 | LiCoO$_2$ | 0.1 | 0.1 | 0.05 | Acceptable |
| 2 | LiCoO$_2$ | 0.5 | 0.5 | 0.02 | Acceptable |
| 3 | LiCoO$_2$ | 0.6 | 0.6 | 0.002 | Unacceptable |

As indicated by the results of Nos. 1 and 2 in Table 3, when the stress after the bonding was controlled to a range from 0.02 to 0.05 kg/cm$^2$, the height difference between the targets was suppressed to within ±0.5 mm, generation of particles at edges of the target can be prevented. Furthermore, the bonding ratio did not decrease as the thickness of the brazing material became 0.1 mm or larger.

When the stress after the bonding was smaller than 0.02 kg/cm$^2$ as in the case of No. 3 in Table 3, on the other hand, the thickness of the brazing material and the height difference between the targets became significant, inducing generation of particles at edges of the targets.

Example 4

In the present example, by using a lithium cobaltate (LiCoO$_2$) sintered body as a raw material of the Li-containing oxide sputtering target, bonding ratio of the sputtering target to a backing plate (simply referred to as bonding ratio) as well as thickness of the indium oxide layer were measured as explained in the following.

Specifically, target assemblies were prepared in the same manner as No. 3 in the example 1 except that each of the target assemblies was prepared by varying the baking conditions (the mean heating rate from a room temperature to the baking temperature, and the retention time at a temperature of 180±10° C.) before applying In to the target as indicated in Table 4.

The bonding ratio of the respective target assembly thus obtained was measured by a water immersion ultrasonic flaw detection method. The respective target assembly was covered with a film for the measurement in order to prevent from being wet. In the present example, target assemblies having a measured bonding ratio of 90% or larger were rated acceptable.

The thickness of an indium oxide layer was determined from a picture of a cross-section of a bonding surface cut out of a target assembly and taken under a scanning electron microscope (SEM). In the present example, target assemblies having a thickness of the indium oxide layer of 100 μm or smaller thus calculated were rated acceptable.

The results are summarized in Table 4. The rightmost column in Table 4 is for total judgment. When both of the criteria regarding the bonding ratio and the thickness of indium oxide layer were satisfied, then the total judgment was rated acceptable. When any one of the criteria was not satisfied, then the total judgment was rated unacceptable.

TABLE 4

| | | | Thickness of indium | Baking condition | | |
|---|---|---|---|---|---|---|
| No. | Material | Bonding ratio (%) | oxide layer (μm) | Mean heating rate (° C./min.) | Retention time (min.) | Total judgment |
| 1 | LiCoO$_2$ | 98 | 22 | 2.0 | 30 | Acceptable |
| 2 | LiCoO$_2$ | 96 | 35 | 2.0 | 120 | Acceptable |
| 3 | LiCoO$_2$ | 88 | 60 | 2.0 | 150 | Unacceptable |
| 4 | LiCoO$_2$ | 97 | 120 | 2.0 | 15 | Unacceptable |

As indicated by Nos. 1 and 2 in Table 4, when the baking time was within a range from 30 to 120 minutes, the bonding ratios were larger than or equal to 90% while the thicknesses of the indium oxide layers were smaller than or equal to 100 μm, whereby abnormal discharge can be prevented.

In the meantime, as indicated by No. 3 in Table 4, when the baking time was extended, the bonding ratio was decreased by thermal oxidation of the target, and the sputtering characteristics were deteriorated. When the baking time was short as for No. 4 in Table 4, the formed indium oxide layer became thick due to discharge the absorbed moisture. Even if the bonding ratio was larger than 90%, In was eluted during sputtering and induced abnormal discharges.

Example 5

In the present example, by using a lithium cobaltate (LiCoO$_2$) sintered body as a raw material of the Li-containing oxide sputtering target, surface roughness Ra of respective sputtering target was measured after the bonding. Film deposition experiments were carried out by using each of the targets.

Specifically, each of the target assemblies was prepared in the same manner as in No. 3 of example 1 except that the surface of the target was polished by using a nonwoven fabric so that the surface roughness Ra was in the range indicated in Table 5. Ra was measured based on JIS B 0601:2001 (standard length of 0.8 mm) by using a tracer type surface roughness meter.

Film deposition experiments were carried out as described in the following.
  Film Deposition by DC Discharge Sputtering
  Film deposition apparatus: a DC magnetron sputtering apparatus was used.
  Film deposition conditions: substrate temperature: 20° C.; DC discharge power: 160 W; sputtering gas pressure: 3 mTorr; sputtering gas: Ar was used; and thickness of the deposited film: 500 nm.

Film deposition sequence: Each of the targets was mounted on the sputtering apparatus, and a glass substrate was placed on a substrate stage opposite to the target. The inside of a chamber was made to the vacuum at a pressure of $8 \times 10^{-4}$ Pa or lower by a vacuum pump. Then, the sputtering gas was fed to the inside of the chamber using a mass flow. The sputtering gas pressure was adjusted to 3 mTorr, and a high voltage was applied to the target using a DC (direct current) power supply to cause plasma discharge. The discharge power was adjusted to 160 W, and a film was deposited to have a thickness of 500 nm.

The results are indicated in Table 5.

TABLE 5

| No. | Material | Target surface roughness Ra (μm) |
|---|---|---|
| 1 | LiCoO$_2$ | 0.33 |
| 2 | LiCoO$_2$ | 0.38 |
| 3 | LiCoO$_2$ | 1.39 |
| 4 | LiCoO$_2$ | 0.02 |

Nos. 1 to 3 in Table 5 maintained stable discharge as the respective surface roughness Ra of the targets was controlled to the range of 0.1 to 3.0 μm.

On the other hand, No. 4 in Table 5 having Ra of smaller than 0.1 μm did not sufficiently release the adsorbed moisture. Arching marks due to abnormal discharge were caused in the initial discharge process.

The sputtering surface and all of the side surfaces of the No. 3 target in Table 6 were covered by using a silicone-based tape while nothing was done for the bonding surface of the target.

For Nos. 4 and 5 in Table 6 a silicone rubber sheet was placed on a hot plate, and respective target was disposed on the silicone rubber sheet. Sputtering surface and side surfaces of the No. 5 target were covered by using an aluminum foil.

The specific resistance before and after bonding was measured by a four-point terminal method. Specifically, by using a resistivity meter Loresta GP available from Mitsubishi Chemical Analytech Co., Ltd. equipped with a probe having an inter-terminal distance of 1.5 mm, the specific resistance was measured on a surface which has been contacted to each of the members. The measurement was carried out four times, and a mean value and a maximum value were respectively determined. In the present example, target assemblies having a mean specific resistance value of 100 Ω·cm or smaller and a maximum specific resistance value of 1000 Ω·cm or smaller before and after the bonding were rated acceptable.

The amounts of C and Si before and after the bonding were measured by a combustion-infrared absorption method and an absorption spectrophotometry, respectively. In the present example, target assemblies having an amount of C of smaller than 0.01% by mass and an amount of Si of smaller than 0.01% by mass before and after the bonding were rated acceptable.

The results are summarized in Table 6.

TABLE 6

| | Bonding conditions | | | Specific resistance before bonding | | | | Specific resistance after bonding | | | |
|---|---|---|---|---|---|---|---|---|---|---|---|
| | | | | Contacted surface | | | | Contacted surface | | | |
| No. | Masking tape | Buffer material | Heat insulating cover | Mean value | Maximum value | Amount of C (% by mass) | Amount of Si (% by mass) | Mean value | Maximum value | Amount of C (% by mass) | Amount of Si (% by mass) |
| 1 | — | — | — | 2.2E+01 | 2.6E+01 | <0.01 | <0.01 | 2.4E+01 | 2.8E+01 | <0.01 | <0.01 |
| 2 | — | — | Present | 2.5E+01 | 2.6E+01 | <0.01 | <0.01 | 4.0E+01 | 4.1E+01 | <0.01 | <0.01 |
| 3 | Silicone-based tape | — | — | 2.2E+01 | 2.6E+01 | <0.01 | <0.01 | 3.7E+05 | 9.5E+05 | 0.04 | 0.02 |
| 4 | — | Silicone rubber sheet | — | 2.8E+01 | 3.2E+01 | <0.01 | <0.01 | 1.6E+03 | 5.6E+03 | 0.04 | 0.02 |
| 5 | — | Silicone rubber sheet | Present | 2.6E+01 | 2.8E+01 | <0.01 | <0.01 | 3.3E+04 | 6.9E+04 | 0.04 | 0.02 |

Example 6

In the present example, by using a lithium cobaltate (LiCoO$_2$) sintered body as a raw material of the Li-containing oxide sputtering target, specific resistance and amounts of C and Si of the target were measured before and after the bonding.

Specifically, the target assemblies were prepared in the same manner as in the example 1 except that each member of a silicone-based kapton tape available from Nitto Denko Corp. as a masking tape, a silicone rubber sheet available from Tigers Polymer Corp. as a buffer material, and an aluminum foil as a heat insulating cover were disposed as indicated in Table 6.

In detail, the sputtering surface and side surfaces of the No. 2 target in Table 6 were covered by using an aluminum foil.

As the bonding was carried out without disposing a masking tape or a silicone rubber sheet for targets Nos. 1 and 2 in Table 6, the specific resistance at the contacted surface did not increase, and the amounts of C and Si were suppressed low.

On the other hand, when the bonding was carried out by contacting a masking tape or a silicone rubber sheet to targets as for Nos. 3 to 5 in Table 6, the amounts of C and Si were increased and the specific resistance at the contacted surface increased after the bonding.

EXPLANATION OF REFERENCE NUMERALS

21 Target assembly
23 Backing plate
24A-24D Sputtering target
25 Lining member 31A, 31B, 31C Bonding material
32 Spacer
T Gap

The invention claimed is:

1. A Li-based oxide target assembly, comprising:
   a Li-based oxide sputtering target,
   a backing plate, and
   a bonding material,
   wherein;
   the Li-based oxide sputtering target consists of Li, O, at least one element selected from the group consisting of Co, Mn, Ni, Fe, P, and B, and impurity elements of Si and C,
   the Li-based oxide sputtering target is bonded to the backing plate through the bonding material, and
   the Li-based oxide sputtering target has a bending strength of 20 MPa or larger.

2. The Li-based oxide target assembly according to claim 1, which is manufactured under a non-aqueous condition.

3. The Li-based oxide target assembly according to claim 1, wherein
   a mean value of specific resistance of the Li-based oxide sputtering target is smaller than or equal to 100 Ω-cm, and
   a maximum value of the specific resistance of the Li-based oxide sputtering target is smaller than or equal to 1000 Ω-cm.

4. The Li-based oxide target assembly according to claim 1, wherein
   C is present in a content of smaller than 0.01% by mass, and
   Si is present in a content of smaller than 0.01% by mass.

5. The Li-based oxide target assembly according to claim 1, wherein
   the Li-based oxide sputtering target has a surface roughness Ra of from 0.1 µm to 3.0 µm.

6. The Li-based oxide target assembly according to claim 1, which has a misalignment of 1.0 mm or smaller.

7. The Li-based oxide target assembly according to claim 1, which comprises two or more Li-based oxide sputtering targets,
   wherein a gap between adjacent Li-based oxide sputtering targets is from 0.1 mm to 0.5 mm.

8. The Li-based oxide target assembly according to claim 1, which comprises two or more Li-based oxide sputtering targets,
   wherein an absolute value of a height difference between the Li-based oxide sputtering targets is 0.5 mm or smaller.

9. The Li-based oxide target assembly according to claim 1, wherein the Li-based oxide sputtering target adheres to the backing plate at a bonding ratio of 90% or larger.

10. The Li-based oxide target assembly according to claim 1, wherein the Li-based oxide sputtering target is made from a Li-containing phosphorus compound.

11. The Li-based oxide target assembly according to claim 10, wherein the Li-containing phosphorus compound is lithium phosphate.

12. The Li-based oxide target assembly according to claim 1, wherein the Li-based oxide sputtering target is made from a Li-containing boric acid compound.

13. The Li-based oxide target assembly according to claim 12, wherein the Li-containing boric acid compound is lithium triborate.

14. The Li-based oxide target assembly according to claim 1, wherein the Li-based oxide sputtering target is made from at least one of lithium cobaltate and lithium phosphate.

15. The Li-based oxide target assembly according to claim 1, wherein the backing plate is a Cu-based backing plate or an Al-based backing plate.

16. The Li-based oxide target assembly according to claim 1, wherein the bonding material is a brazing material, which has a thickness of 0.1 mm or more.

17. The Li-based oxide target assembly according to claim 1, wherein
   the bonding material is an In-based solder, which forms an indium oxide layer at a bonding surface of the Li-based oxide sputtering target, and
   the indium oxide layer has a thickness of 100 µm or smaller.

* * * * *